(12) United States Patent
Fang

(10) Patent No.: US 9,232,322 B2
(45) Date of Patent: Jan. 5, 2016

(54) HEARING AID DEVICES WITH REDUCED BACKGROUND AND FEEDBACK NOISES

(71) Applicant: Zhimin Fang, London, CA (US)

(72) Inventor: Zhimin Fang, London, CA (US)

( * ) Notice: Subject to any disclaimer, the term of this patent is extended or adjusted under 35 U.S.C. 154(b) by 94 days.

(21) Appl. No.: 14/171,648

(22) Filed: Feb. 3, 2014

(65) Prior Publication Data

US 2015/0222997 A1 Aug. 6, 2015

(51) Int. Cl.
*H04R 25/00* (2006.01)
*H03G 3/00* (2006.01)

(52) U.S. Cl.
CPC .............. *H04R 25/50* (2013.01); *H04R 25/453* (2013.01); *H04R 25/505* (2013.01); *H03G 3/00* (2013.01); *H04R 25/30* (2013.01); *H04R 25/356* (2013.01); *H04R 2225/41* (2013.01); *H04R 2225/43* (2013.01); *H04R 2430/01* (2013.01)

(58) Field of Classification Search
CPC ...... H04R 25/30; H04R 25/305; H04R 25/35; H04R 25/353; H04R 25/356; H04R 25/45; H04R 25/453; H04R 25/502; H04R 25/505; H04R 25/70; H04R 2225/39; H04R 2225/41; H04R 2225/43; H04R 2430/01; H04R 2430/03
USPC ........ 381/23.1, 312, 315, 317, 318, 320, 321, 381/56, 57, 60, 94.2, 94.3, 94.5, 107, 109; 181/129, 130, 135; 600/25
See application file for complete search history.

(56) References Cited

U.S. PATENT DOCUMENTS

| | | | | |
|---|---|---|---|---|
| 4,622,440 A * | 11/1986 | Slavin | ........................... | 381/313 |
| 4,879,746 A * | 11/1989 | Young et al. | ............. | 379/399.02 |
| 6,097,823 A * | 8/2000 | Kuo | ............................... | 381/312 |
| 6,173,063 B1 * | 1/2001 | Melanson | ..................... | 381/318 |
| 6,731,768 B1 * | 5/2004 | Delage | .......................... | 381/312 |
| 6,826,286 B1 * | 11/2004 | Arndt et al. | ................... | 381/312 |
| 6,937,738 B2 * | 8/2005 | Armstrong et al. | ........... | 381/312 |
| 7,042,986 B1 * | 5/2006 | Lashley et al. | .................. | 379/52 |
| 7,519,193 B2 * | 4/2009 | Fretz | .............................. | 381/312 |
| 7,881,487 B2 * | 2/2011 | Dickel et al. | ................... | 381/314 |
| 8,090,118 B1 * | 1/2012 | Pandey et al. | ................... | 381/93 |
| 8,320,603 B2 * | 11/2012 | Bass | .............................. | 381/381 |
| 2002/0051546 A1 * | 5/2002 | Bizjak | .......................... | 381/106 |
| 2002/0167363 A1 * | 11/2002 | Yang et al. | ..................... | 331/57 |
| 2003/0098805 A1 * | 5/2003 | Bizjak | .......................... | 341/139 |

(Continued)

OTHER PUBLICATIONS

Maxim Integrated, "Using a DS1802 Pushbutton Digital Potentiometer to Create an Audio Preamplifier with Attenuator," dated Jun 27, 2002, 5 pgs.*

*Primary Examiner* — Curtis Kuntz
*Assistant Examiner* — Joshua Kaufman
(74) *Attorney, Agent, or Firm* — Dale & Lessmann LLP

(57) ABSTRACT

A personal sound processing apparatus has an earphone; a microphone; an electronic sound processor connected between an automatic gain controller (AGC) and a digital volume controller, an automated feedback tracker operatively connected to the microcontroller, and an audio signal amplifier to amplify audio signals which level is controlled by the digital volume controller. The microcontroller is configured to execute electronic instructions for recognizing at least one of a feedback noise condition and a background noise condition in the audio signals and to send a control signal to the digital volume controller to adjust volume level in response to presence of the at least one of the feedback noise condition and the background noise condition.

20 Claims, 4 Drawing Sheets

(56) References Cited

U.S. PATENT DOCUMENTS

| | | | |
|---|---|---|---|
| 2003/0160711 A1* | 8/2003 | Jorgensen et al. | 341/16 |
| 2005/0141737 A1* | 6/2005 | Hansen | 381/316 |
| 2005/0195996 A1* | 9/2005 | Dunn et al. | 381/105 |
| 2005/0213780 A1* | 9/2005 | Berardi et al. | 381/103 |
| 2006/0104460 A1* | 5/2006 | Behboodian et al. | 381/94.1 |
| 2006/0139030 A1* | 6/2006 | Hubbard et al. | 324/322 |
| 2006/0222192 A1* | 10/2006 | Matthey | 381/312 |
| 2006/0222194 A1* | 10/2006 | Bramslow et al. | 381/314 |
| 2007/0041589 A1* | 2/2007 | Patel et al. | 381/73.1 |
| 2007/0081682 A1* | 4/2007 | Dickel et al. | 381/312 |
| 2007/0183609 A1* | 8/2007 | Jenn | 381/312 |
| 2007/0189561 A1* | 8/2007 | Dijkstra et al. | 381/315 |
| 2007/0230726 A1* | 10/2007 | Giesner et al. | 381/312 |
| 2008/0165988 A1* | 7/2008 | Terlizzi et al. | 381/119 |
| 2008/0310659 A1* | 12/2008 | Kim et al. | 381/316 |
| 2009/0245537 A1* | 10/2009 | Morin | 381/107 |
| 2010/0040239 A1* | 2/2010 | Fretz | 381/60 |
| 2010/0040240 A1* | 2/2010 | Bonanno | 381/74 |
| 2010/0040247 A1* | 2/2010 | Ypma et al. | 381/314 |
| 2010/0054510 A1* | 3/2010 | Schumaier | 381/314 |
| 2010/0124349 A1* | 5/2010 | Bass | 381/379 |
| 2011/0280409 A1* | 11/2011 | Michael et al. | 381/60 |
| 2012/0014553 A1* | 1/2012 | Bonanno | 381/364 |
| 2012/0300963 A1* | 11/2012 | Rauch et al. | 381/315 |
| 2013/0156224 A1* | 6/2013 | Keane et al. | 381/97 |
| 2013/0343587 A1* | 12/2013 | Naylor | 381/318 |
| 2014/0064529 A1* | 3/2014 | Jang | 381/317 |
| 2014/0247956 A1* | 9/2014 | Andersen et al. | 381/316 |
| 2014/0270294 A1* | 9/2014 | Andersen et al. | 381/321 |
| 2014/0321682 A1* | 10/2014 | Kofod-Hansen et al. | 381/315 |

* cited by examiner

HEARING AID DEVICES WITH REDUCED BACKGROUND AND FEEDBACK NOISES

FIELD OF INVENTION

The invention relates generally to the field of sound processing. In particular, the invention relates to a sound processing apparatus for use as a hearing aid device and to methods and electronic configurations for reducing background and feedback noises in such devices.

BACKGROUND OF INVENTION

Hearing aid devices, or hearing aids, cannot correct hearing loss but are an aid that makes external sounds more assessable through amplifying them. However, hearing aids use microphones, electronic resistors, amplifiers and other electronic components. These components all produce noise and heat that is perceptible by the user. The volume of these background noises can be as loud as that of ordinary conversation taking place a meter away from a hearing aid user. Such noises are extremely annoying and uncomfortable to the hearing aid user, even when the surroundings are actually very quiet. Contrary to the common assumption that hearing impaired people cannot hear these white noises, survey and experiments show that most people, including hearing aid users, are quite sensitive to background white noises. Moreover, while hearing impaired people generally have difficulty hearing conversations and other sounds around them, they can certainly hear high decibel noises of various frequencies.

Current hearing aids on the market have a number of common problems and defects. There are currently three types of commonly used hearing aids now: body worn hearing aids, behind-the-ear (BTE) hearing aids, and in-the-ear (ITE) hearing aids.

With body worn hearing aids, the device amplifies background noises while making the sound signals loud enough for the user to hear. Such noises are continuous and of very high decibels (dB), usually 55 dB or more, which is at a similar volume to that of a person speaking at normal volume from one meter away from the aid user. Such background noises are a nuisance to the aid user, especially when the surroundings are very quiet. The hearing aid's sound sensor (e.g., a microphone) is usually placed in the device's case and any contact with the case, such as friction with clothing, accidental touch by hand, etc., tends to produce irritating high volume noises as a result of amplification by the hearing aid device. Volume adjustment often is achieved through a mechanical potentiometer via a turning knob; therefore volume control is difficult to be precise. Improper use of the body worn aid devices therefore tends to result in high dB feedback noise. Further, earphone used in a hearing aid device is usually the moving-iron type that produces annoying and uncomfortable high frequency sounds and also causes sound distortion. Sound generated by such feedback often is a squealing/whistling high frequency sound that can cause further hearing impairment. Occlusion effect is a common complaint for users of conventional body worn hearing aids.

With BTE hearing aids, the aid amplifies background noises while it makes the sound signals loud enough for the user to hear. Such amplified noises are continuous and of very high decibels (dB) (usually 55 dB or more, at a similar volume to that of a person speaking from one meter away from the aid user). They are a real nuisance to the aid user, especially when the surroundings are very quiet. Volume adjustment is achieved through a micro mechanical potentiometer via a turning knob. Because the mechanism often is very tiny for a behind-the-ear (BTE) hearing aid device, it is very hard for the user to set the volume at the desired level. Because of the structural design of the BTE aid, the microphone and the loudspeaker are placed close to one another so the earphone must be plugged tightly in the user's outer ear; if not, the sound amplifying mechanism tends to produce high dB feedback noises that can cause further hearing impairment. The earphone uses the moving-iron type loudspeaker that produces ear-splitting high frequency sounds, another nuisance to the user. Because the battery used generally is required to be tiny so it can fit into the small size of a BTE aid device, battery lift is short. As a result, the user has to change the battery frequently, which is a cost concern. Occlusion effect is also a common complaint for users of conventional BTE hearing aids.

ITE hearing aids are custom made to fit each individual's ear and they are very expensive. Because the components are tiny, normal maintenance is more complicated, therefore not really convenient for elderly users. When such an ITE device malfunctions, e.g., due to defects or damages, repair time tends to be long and cost is also high. Battery life is short and battery change is frequent, which is a cost concern. The volume adjustment mechanism is micro and tiny; as a result it is not convenient for the user. As a design requirement, ITE hearing aids generally must fit perfectly in the user's outer ear bawl to prevent sound leaking. However this tight fit condition often causes discomfort. Venting also produces high dB feedback noises that can cause further hearing impairment. ITE earphones use micro moving-iron-type loudspeakers that may cause sound distortion. Occlusion effect is a common complaint for users of conventional ITE hearing aids.

Current noise elimination technology digitally processes analog signals (i.e., sound signals). To do so, samples must be selected from the input sound signals. However, no matter how fast or how precisely samples are taken, the stored data is never the same as the actual sound signals. Digitalization cannot duplicate precisely and completely the original signals. This distortion caused by digitalization is called "quantizing distortion". Processing digital signals relies on the digital circuit's working frequency (or sampling frequency). In order to keep the sampled signals substantially the same as the input sound signals, sampling frequency must be set high. However, high frequency necessitates increased electrical current, which in turn leads to high power consumption. Digital technology can eliminate some noise, but digital noise elimination generally is based on certain algorithms that are implemented as computer programs developed by a programmer. Since there are numerous kinds of noises in the real world environment, it is generally not possible to include all possible scenarios in one or a small number of algorithms. Current technology of digital filtering and frequency compensation tend to make the original and natural sound signals differ greatly from those a listener has been exposed to and used to. Consequently the processed sound signals may cause perception problems or mental/physical discomfort.

Current analog technology used for noise elimination uses various electronic techniques, especially analog filters. However, because sound signals are of diverse noise frequencies, it is extremely difficult to determine a priori while designing the filter which range of frequencies should be eliminated. Moreover, in the process of filtering, certain frequencies in normal and natural sounds will be faded out or eliminated altogether, which leads to sound distortion. Sound distortion usually causes difficulty in detecting and distinguishing sounds, especially for people who suffer from hearing problems.

It is known to use electronic techniques to deal with feedback noise. The following are some examples, which all have their own disadvantages and difficulties.

Frequency Shift: A 2-8 Hz frequency shift may be performed on the microphone signals so that when the microphone receives sound signals from the speakers, those signals generate reduced feedback. However, frequency shift cannot eliminate feedback noise entirely and typically increases audibility of the original sound by only about 6 dB.

Phase Modulation: In a self-induced feedback in an audio system, the feedback loop (return circuit) is a regenerative one. If sound signals from the microphone are processed by phase modulation, conditions for feedback self-excitation will be broken. However, high level phase modulation will distort sound effect and sound signals will sound unnatural to the listener.

Time Delay: Signals from the microphone may be recorded and played back after a time delay. Time delay can prevent feedback self-excitation in the audio system, no matter how loud the sound volume is tuned. However, time delay can only be used to prevent feedback when the signal from the microphone is very brief or in situations where the time delay does not cause perception issues. It is not suitable for use during conversation, due to the time delay between lip movement and sound perception.

Feedback Sensor: Feedback sensors can be used to decrease the amplifying effect of an amplifier. However, using a feedback sensor usually makes the sound volume too low.

The forgoing creates challenges and constraints for providing sound processing devices addressing the aforementioned difficulties and deficiencies. There remains a need for improving performance of sound processing devices, for example hearing aids, especially in terms of reducing feedback to improve hearing aid performance and reduce the likelihood of further hearing damage. It is also important that these sound processing devices be low cost, easy to maintain and have acceptable real world performance. It is an object of the present invention to mitigate or obviate at least one of the above mentioned disadvantages.

SUMMARY

According to an aspect of the present invention, there is provided a personal sound processing apparatus comprising: an earphone; a microphone spaced apart from the earphone; an electronic sound processor comprising, an automatic gain controller (AGC) connected in parallel to an automated feedback tracker, a microcontroller and a digital volume controller, the microcontroller operatively connected to the digital volume controller, wherein the microcontroller is configured to execute electronic instructions for recognizing a feedback noise condition and background noise condition, and for modulating the digital volume controller in response to presence of the feedback noise condition and background noise condition.

According to another aspect of the disclosure, there is provided an electronic sound processor for use in conjunction with a microphone and speaker comprising an automatic gain controller (AGC) connected in parallel to an automated feedback tracker, a microcontroller and a digital volume controller, the microcontroller operatively connected to the digital volume controller, wherein the microcontroller is configured to execute electronic instructions for recognizing a feedback noise condition and background noise condition, and for modulating the digital volume controller in response to presence of the feedback noise condition and background noise condition.

The microcontroller may comprise an analog to digital converter, a microprocessor, and a non-transient electronic storage medium for storing the electronic instructions. The microcontroller may comprise a digital signal processor (DSP).

The automatic feedback tracker may comprise a digital frequency divider circuit. Alternatively, the automatic feedback tracker may comprise a signal amplifier connected to the automatic gain controller, a counter connected in parallel to the signal amplifier and a timer, the counter being configured to divide a signal received from the signal amplifier by a pre-determined value, the timer being configured to provide a pre-determined time length over which the signal is to be frequency divided. The counter may comprise a digital processor and a transient electronic storage medium configured to perform the signal division and temporarily store values arising from the signal division for subsequent retrieval or transmittal to the microcontroller. The pre-determined value may be 2, 4, 8, 16, 32, 64 or 128.

The sound processor may be located within a wearable housing. The earphone and microphone may be located on a wearable headphone that is removably attachable to the wearable housing. The microphone may be spaced apart from the earphone by a distance of at least 3 cm. The wearable housing may comprise a digital display for outputting a numerical value relating to an amplifier setting of the apparatus. The numerical value may be a decibel value of a sound output of the apparatus. The apparatus may comprise a user interface (for example, one or more buttons or a touch screen) for providing a user selectable indication of background noise level to the automatic gain controller or both the automatic gain controller and the microcontroller.

The earphone may comprise a moving coil speaker. The earphone may comprise an oval tip on a moveable portion that is rotatable relative to a non-moveable portion of the earphone to change the orientation of the oval tip. The oval tip may be angled with respect to the moveable portion at an angle that is complementary to an ear canal of a user of the apparatus, for example at an angle of from 15 to 35 degrees.

The digital volume controller may comprise an analog to digital converter, a digital potentiometer and a digital potentiometer interface controllable by the microcontroller for adjusting the digital potentiometer. The digital volume controller may be connected to or integrated with an amplifier for increasing a magnitude of an analog sound output of the digital volume controller. The amplifier may be manually controllable by a user of the apparatus.

In the personal sound processing apparatus, background noises may be reduced or substantially eliminated. In particular, squealing/whistling feedback noise may be cancelled to obtain substantial quiet, allowing ambient sounds to be heard more readily by the user. The ambient sounds may comprise musical sounds or signals.

The reduction in noise may be achieved by automatically lowering sound volume. Upon substantial elimination of the feedback noise below a pre-determined threshold, the sound volume of the apparatus may be immediately returned to a pre-set volume level chosen by the user.

With respect to use by hearing impaired users, wherein the personal sound processing device may be considered a type of hearing aid, the earphones are designed to provide a high degree of sound isolation. The earphone design may allow for inter-changing the oval tip of the earphone into a round tip or any other suitable shape. The oval tip may comprise a resilient plastic material. As a result, the earphone may conform securely and comfortably to the ear's shape. A silicone or foam covering may be provided to improve comfort and sound isolation. Sound isolation may also lead to a reduction in the required amplification of the earphone/speaker; therefore volume can be turned lower, leading to reduced risk of hearing damage and a reduction of background or electronic noise. The portion of the earphone comprising the oval tip may be movable (for example, rotatable relative to the remainder of the earphone) and the earphone can thereby be used for the right or the left ear. Use of a moving-coil speaker instead of a moving-iron speaker (as is commonly used in conventional hearing aids) may greatly improve audio fidelity in terms of tone, pitch, quality and bandwidth. Use of a rechargeable lithium battery may provide a reduction in power consumption leading to fewer battery changes and fewer recharges, which is not only cost efficient but also environmentally friendly. The sound processing apparatus may also feature a stylish design and may comprise interchangeable coverings or skins to be used as a fashion accessory. The earphone, microphone and housing may resemble portable music/media players so that users may not be easily identified as hearing aid users.

The sound processing apparatus may be part of any type of audio system that utilizes microphones and speakers; for example, hearing aids, karaoke machines, telephone equipment, amplifiers, recording machines, mobile phones, etc. The invention is especially useful for hearing aids.

Further features will be described or will become apparent in the course of the following detailed description. It should be understood that each feature described herein may be utilized in any combination with any one or more of the other described features, and that each feature does not necessarily rely on the presence of another feature except where described explicitly or evident to one of skill in the art.

BRIEF DESCRIPTION OF DRAWINGS

For the purposes of description, but not of limitation, the foregoing and other aspects of the invention are explained in greater detail with reference to the accompanying drawings, in which.

DETAILED DESCRIPTION

Figure 1:
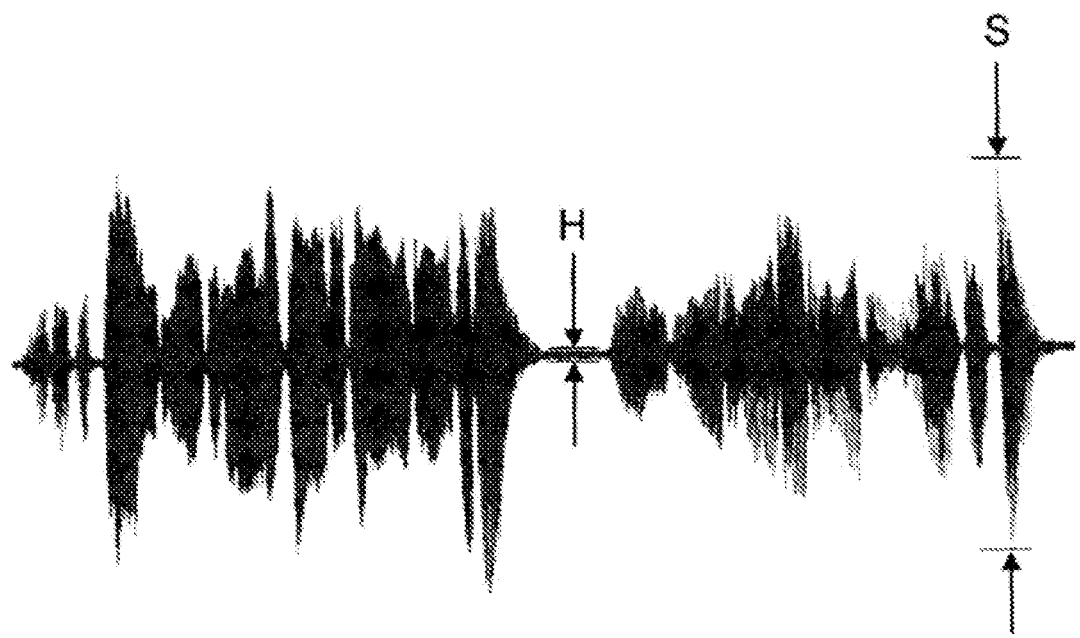
FIG. 1 depicts a sound signal to be read by a sound processing apparatus in which H represents ultimate volume of background noise produced by electronic components in the absence of external sound signal, and S represents ultimate volume of external sound signal that has been amplified.

The description which follows and the embodiments described therein are provided by way of illustration of an example, or examples, of particular embodiments of the principles of the present invention. These examples are provided for the purposes of explanation, and not limitation, of those principles and of the invention. In the description which follows, like parts are marked throughout the specification and the drawings with the same respective reference numerals.

Figure 2:
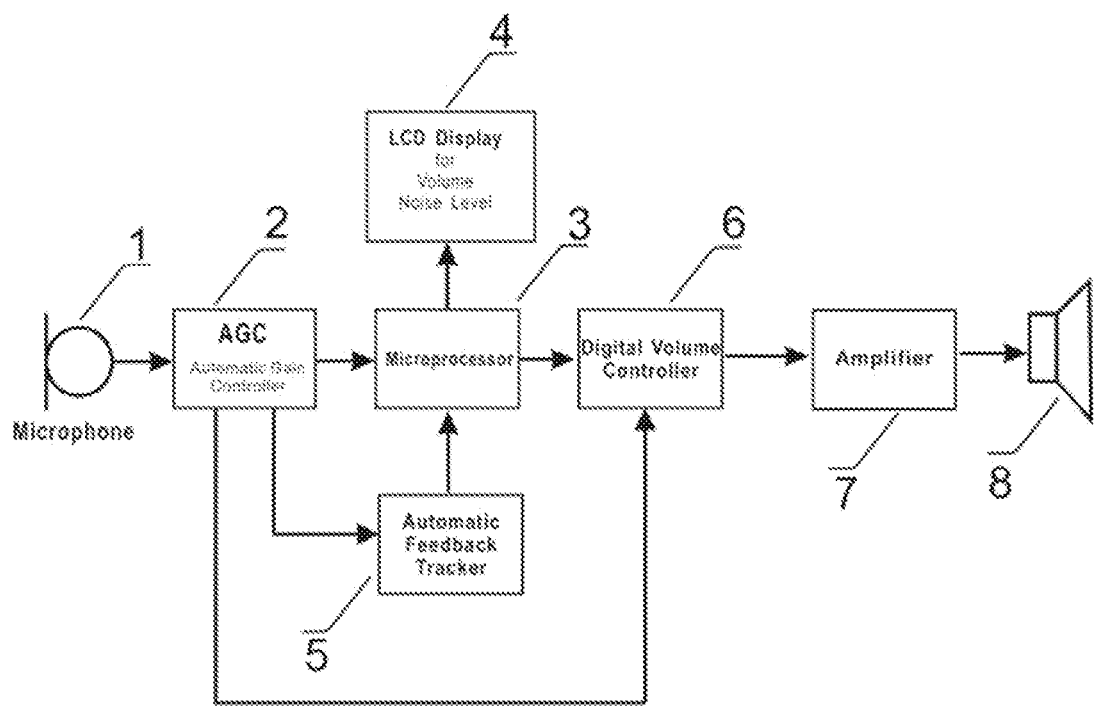
FIG. 2 depicts a schematic diagram of electronic components of a sound processing apparatus.

FIG. 2 depicts a schematic diagram of a sound processing apparatus. As is shown in FIG. 2, an audio signal receiving and conversion element, such as a high-sensitivity microphone 1, receives external sound signals and sends audio signals converted from the sound signals to an optional pre-amplifier, such as an automatic gain control (AGC) 2, for maintaining the output audio signals from the pre-amplifier in a normalized range and for amplification, where required. This also helps prevent sound distortion due to overloading. For example, when the sound signals are extremely loud, the AGC 2 reduces amplification or suppresses the intensity level of the corresponding audio signals, thus avoid overloading the audio signal amplifier 7 and help maintain audio fidelity. When the sound signals are low, i.e., when the signal-to-noise ratio (SNR) is low, the AGC 2 amplifies the audio signals accordingly. Such pre-amplification, e.g., amplification by AGC, enables proper reception of sound signals from some distance. The pre-amplified audio signals are sent to the microcontroller 3. The microcontroller 3 processes the audio signal to obtain a background noise or feedback noise condition, which then accordingly controls the volume setting of the digital volume controller 6. The pre-amplified audio signals are also sent to the audio signal amplifier 7 for amplification, whose output volume level is set by a digital volume controller (DVC) 6, controlled by the microcontroller 3 according to the background noise and/or feedback noise condition.

Figure 3:
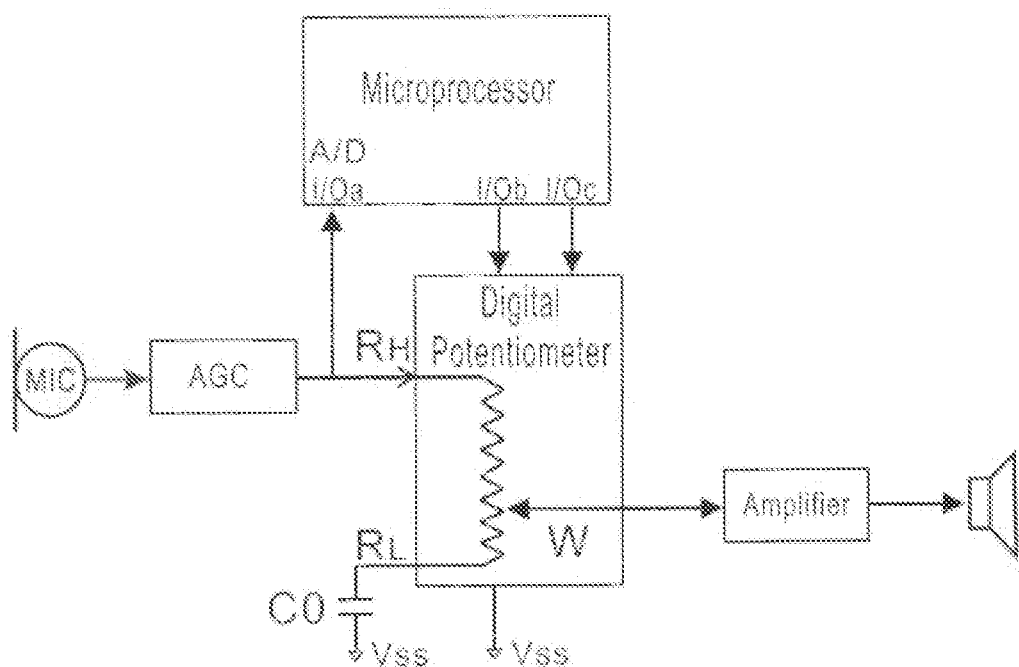
FIG. 3 depicts a circuit diagram of an example of a digital volume controller.

Referring to FIG. 3, digital volume controller 6 may comprise an analog to digital converter A/D, a digital potentiometer and a digital potentiometer interface (e.g., I/Ob and I/Oc) controllable by the microcontroller for adjusting the digital potentiometer. The digital volume controller may be connected to or integrated with an amplifier for controlling its amplification and setting its output level of analog sound output. Of course, the digital volume controller may also be conveniently integrated with the microcontroller. As will be further described below, a capacitor C0 is used to buffer sudden potential changes caused by rapid, i.e., step changes in electrical potentials at the digital potentiometer when volume setting at W is digitally and quickly adjusted by the microprocessor of the microcontroller. The digital volume controller may be manually controllable by a user of the apparatus, for example, to set an output volume level that the user feel comfortable, set the threshold value manually for the background noise, or instruct the microcontroller to set the threshold value automatically according to ambient sound environment.

Although not shown, one skilled in the art will understand that the microcontroller may comprise an analog to digital converter, a microprocessor, a non-transient electronic storage medium for storing the electronic instructions and user selected threshold values and volume level values, and a transient electronic storage medium for temporarily storing values arising from the execution of the electronic instructions by the microprocessor. A digital signal processor (DSP) may be used in place of some or all functions of the microcontroller.

FIG. 1 depicts a sound signal in a hearing aid. The letter H in FIG. 1 represents the maximum volume level of ambient background noise or white noises produced by electronic components (together or separately, the "background noise") when there is no external sound signal. The letter S in FIG. 1 represents the maximum volume level of external sound signal that has been amplified.

To identify presence of background noise and sound signals containing information (such as speech) in the audio signals, the microcontroller 3 of the apparatus (FIG. 2) may have pre-programmed values that the user can select as the threshold value for background noises. Conveniently, the storage medium may be used for storing such threshold values. The microcontroller 3 may be programmed (i.e., configured) to execute instructions stored on the storage medium for recognizing a background noise or a feedback noise condition or for performing other control functions. For example, the microcontroller 3 may be programmed to digitally process the audio signals received to obtain an estimate of background noise HI and use the pre-selected threshold value to measure external sound signals. Or, the user of the apparatus can select a background noise, and the microcontroller 3 may store the background noise in transient memory or non-transient memory. The microcontroller 3 uses the stored background noise signal as a threshold value to measure external sound signals. When the microcontroller 3 receives external sound signals no higher than the threshold value, the microcontroller 3 treats the sound signals as background noise and recognize them as such. In response, the microcontroller sends a control signal to the digital volume controller 6 to adjust (i.e., to lower in this case) the volume level of the digital volume controller 6 to a low value, such as zero, to prevent the audio signal amplifier from amplifying the background noises, thus providing a quite environment to the user. When the microcontroller 3 receives external sound signals higher than the threshold value, the microcontroller 3 sends a control signal to the digital volume controller 6, which adjusts (i.e., raises in this case) the volume level to an output volume level value pre-set by the user, so the user can better perceive or hear the sound that communicates information. When the external surroundings quiet down, the microcontroller 3, through the digital volume controller 6, automatically lowers (i.e., reduces) the sound output volume to the threshold value or lower. Consequently, background noises are effectively reduced or eliminated. This provides comfort to users when they read, relax, or enjoy a leisurely moment and thus prefer a quiet environment. It will be appreciated that this automatic reduction of background noise generally has no or almost no perceptible effect on normal conversation, telephone rings, doorbell chimes, alarms or other sound signals that are normally louder than the threshold value; therefore users are able to hear and respond to such sound signals.

As described above, the microcontroller 3 digitally processes the audio signals to obtain the maximum volume level of background noise signal H and stores the processed background noise signal in memory. The microcontroller is programmed, i.e., is configured to process the audio signals to recognize a noise condition, such as a condition that the ambient sound is essentially background noise. The microcontroller 3 uses the stored background noise signal H as a threshold value or uses a pre-selected threshold value to measure external sound signals. The ambient sounds are determined to be merely noises if the ambient sounds are at a level no higher than the selected threshold value. At such low input level, the microcontroller 3, through the digital volume controller 6, sets (or reduces) the output volume to zero, or at least no higher than the threshold value. When the microcontroller 3 receives sound signals higher than the threshold value, the microcontroller 3 sends a control signal to the digital volume controller 6. In response to the control signal from the microcontroller 3, the digital volume controller in turn very quickly and digitally adjusts the volume control to a volume level pre-set by the user. When the external surroundings quiet down, i.e., when the level of ambient sounds is lower than the threshold value again, the microcontroller 3, through the digital volume controller 6, automatically and quickly lowers (or reduces) the volume to the threshold value or lower. As will be understood by one skilled in the art, the digital volume controller 6 controls the output volume level of an audio amplifier 7 (FIG. 2). In a quiet environment with no external sound signals, because of the low volume level set by the digital volume controller 6, background noise is not amplified. Therefore, a sound reproduction element, such as earphone 8, does not receive amplified audio signals that contain merely background noise signals. Consequently, background noises in the earphone 8 are effectively reduced or eliminated.

It will be appreciated that the techniques described herein utilizes digital control techniques to control output volume levels of audio signals, thus permitting more precise control and faster response. In conventional digital potentiometers, volume control is done manually by the user pressing a button (or key) to adjust the sound volume. Because such manual control is relatively slow, noises typical of a digital potentiometer due to step changes of electric potential are not introduced. However, the techniques described herein utilizes a microcontroller that can automatically and quickly trigger step changes of the electric potential in the digital potentiometer according to the changes of the value of the sound signal and the noise level. Such quick adjustment usually produces clattering noises. A zero crossing detection circuit may be used to reduce clatters significantly; however, conventional digital potentiometers with a zero crossing detection circuit often have perceptible residual clatters. The problem may reside in the fact that digital potentiometers currently in use are designed for manual control (that is, to adjust the electric potential by hand, and therefore slowly).

Humans are not sensitive to sound signals that last for a very short period. This period is believed to be shorter than 20 ms. Therefore, it is preferred that the time range for the digital potentiometer be set within 20 ms, i.e., within a time period within which sounds are generally not perceptible to humans. However, because of the step change structure of electric resistance in the digital potentiometer, turning up or down the sound volume in such a very short time span results in loud clatter noises, which is to be avoided, too.

FIG. 3 shows a circuit diagram of an example of a digital volume controller 6 that may be used to reduce the clattering effect. The digital volume controller has a capacitor C0 that helps reduce or substantially eliminate clatter noises. The capacitor C0 provides buffering to overcome sudden changes in volume level and thereby lengthens the effective time span of the change, thereby reducing the clattering effect. This is further described in detail below.

Unlike electric potential in a mechanical potentiometer which changes in a continuous manner, electric potential (or electric resistance) in a digital potentiometer changes in step form. When the electric potential in a digital potentiometer is adjusted, step changes in the signal are produced, either increasing or decreasing the potential. A zero crossing detection circuit does not cause clattering noises only when $R_H$ DC potential equals the $R_L$ DC potential. However, the DC voltage in the circuit causes $R_H$ potential to be higher than $R_L$. When superimposed with AC signals or noise signals, this potential differential remains. Consequently, $R_H$ potential in FIG. 3 is always higher than $R_L$, which would interfere with the normal and proper function of the zero crossing detection circuit and makes elimination of clatter noise impossible. However, through the use of the capacitor C0, the DC current may be blocked off to keep the DC potentials of $R_H$ and $R_L$ at substantially the same value all the time. Thus, AC signals can pass through the capacitor C0, but no sudden changes in the $R_H$ and $R_L$ electric potentials will be triggered so that proper working condition of the zero crossing detection circuit is maintained. The capacitor functions to suppress step changes in direct current electric potentials caused by digitized adjustment to volume level. Consequently, fast adjustment of the digital potentiometer does not result in clatter noises, and, at the same time, potential changes of the sound signals are not impacted.

As described, a microcontroller 3 (see FIG. 2) controls the digital volume controller 6 and adjusts its electric potential in milliseconds. To achieve this, the capacitor C0 is included in the digital potentiometer (see FIG. 3) to obtain DC level suspension, or to make the $R_L$ DC potential in the digital potentiometer remain in a state of suspension. As a result, whatever state the incoming AC signals are in, the $R_H$ and $R_L$ DC potentials in the digital potentiometer are effectively at the same level, and no clattering noises are produced in the output sound signals sent out by the digital potentiometer.

Feedback Noise Reduction and Elimination

Through use of a microcontroller to detect and control feedback noise, the squealing/whistling feedback noise may be reduced or eliminated to provide a brief and quiet moment or to be transformed into a musical signal. At the same time, the sound volume may be automatically lowered to protect the user from inadvertent hearing damage. As soon as the feedback noise is suppressed, the sound volume of the device may be immediately returned to the pre-set volume level chosen by the user.

Feedback noise is a common problem in amplifiers that use a microphone and a speaker/earphone. Feedback noise occurs when sound signals from the speaker or the earphone are received by the microphone where an amplifier amplifies the signals multiple times, resulting in high dB sine-wave sound signals. Such feedback noises often concentrate in a narrow frequency range, or are at a particular frequency. The frequency of feedback varies because of the differences in materials around the microphone or speaker. Usually feedback frequencies fluctuate in a range of 1500 Hz to 5000 Hz, and human ear happens to be most sensitive to sounds and noises of this range. Sounds of such a frequency range can cause earphone users real discomfort and even hearing impairment. A wave form of feedback noise is illustrated by way of the sine wave depicted in FIG. 4.

The technique described herein reduces or eliminates feedback noise using a frequency division technique. When analog signals go through a simple, time-controlled binary counter, the binary counter identities those feedback noise signals through frequency division. When the microcontroller receives sound signals, the microcontroller controls the volume of the output signals accordingly through the digital volume controller, effectively eliminating feedback noise and the possible damage feedback noise causes to the human ear. This is further explained below.

Figure 4:
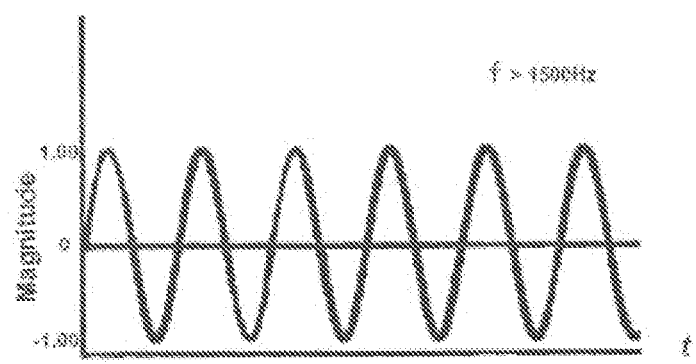
FIG. 4 depicts a wave form of feedback noise.
Figure 5:
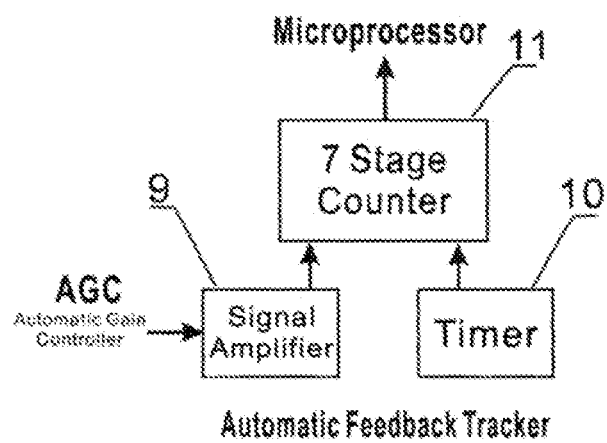
FIG. 5 depicts a schematic diagram of an automatic feedback tracker.

As shown in FIG. 2, the AGC 2 sends the audio signal to an automatic feedback tracker (AFT) 5 for processing audio signals that bear feedback characteristics (see FIG. 4). The AFT 5 may comprise a digital frequency divider circuit. Alternatively, as illustrated in FIG. 5, the automatic feedback tracker may comprise a signal amplifier 9 connected to the automatic gain controller 2, a counter 11 connected in parallel to both the signal amplifier 9 and a timer 10, the counter being configured to divide frequencies of a signal received from the signal amplifier by a pre-determined value, the timer being configured to provide a pre-determined time length over which the signal is repeatedly frequency divided. The counter may comprise a digital processor and a transient electronic storage medium configured to perform the signal division and temporarily store values arising from the signal division for subsequent retrieval or transmittal to the microcontroller. The pre-determined value may be 2, 4, 8, 16, 32, 64 or 128.

The automatic feedback tracker 5 works like a frequency divider/frequency demultiplier. One example of AFT is illustrated in FIG. 5. According to the example, the automatic feedback tracker 5 processes the signal through a binary counter 11, i.e., the higher frequency is changed into lower frequencies. After a few rounds of frequency division, what will be left are mostly those signals that are considered feedback noise (e.g., having a frequency higher than 1500 Hz and in sine wave; as a reference point, a siren alarm made by a police car or an ambulance is lower than 1500 Hz). The processed feedback noise signals are sent by automatic feedback tracker 5 to the microcontroller 3. The microcontroller detects such signals as feedback noise signals, i.e., recognizes this as a feedback noise condition, and sends a control signal to the digital volume controller 6, which in turn reduces the volume of the audio signals to be sent to the amplifier 7 or the output volume of the amplifier 7. This interrupts the feedback cycle and reduces the feedback noise. At the same time, the microcontroller 3 may also rapidly switch on and off the outgoing signals, to further disrupt the feedback noise pattern. Such on and off will only need to be rapid enough (e.g., less than one second) so as to disrupt the feedback noise pattern. Alternatively, the microcontroller 3 may instead send alternative audio signals, such as sound signals produced by a music chip, via the digital volume controller 6 to the amplifier 7 and thence to the earphone 8 so that music replaces the feedback noise.

Referring to FIG. 5, the automated gain controller 2 (see FIG. 2) sends audio signals to an optional signal amplifier 9 of the AFT 5. The signal amplifier 9 increases the volume of audio signals to a certain level for easier processing. The signal amplifier 9 sends the amplified signals to a counter 11, such as a 7-stage counter, for frequency division. As will be appreciated, if the audio signal has sufficiently large amplitude or the counter 11 can be triggered at sufficiently low amplitude, then signal amplifier 9 will not be necessary. The signal amplifier 9 amplifies the audio signal sufficiently to ensure that the amplitude of the amplified audio signals will trigger the counter 11. Simultaneously, a timer 10 repeatedly resets the counter 11 at such intervals such that the counter 11 does not send out any signals if the input signals are at a frequency lower than a selected minimum frequency, such as 1500 Hz. As will be appreciated, this minimum frequency, e.g., 1500 Hz, correlates with the pre-determined time length at which the timer repeatedly resets the counter. Because feedback noise has a frequency higher than 1500 Hz, feedback noise is not removed from the frequency divided signal and is transmitted to the microcontroller 3 (see FIG. 2) at later stages. The microcontroller processes the feedback noise signal by sending a control signal to the digital volume controller 6 (see FIG. 2) to reduce the volume of the feedback signal to a minimum. When this low sound output goes through the audio amplifier 7 (see FIG. 2) and the earphone 8 (see FIG. 2), some very brief low popping sounds may be produced, or the microcontroller may send out musical signals. The popping sounds or the musical signals alert the user to the existence of feedback noise.

Only feedback noises essentially in the form of sine-wave sound signals and noises caused by high frequency sound signals (e.g. loud explosive sounds, high-frequency sounds produced by something being broken, the shrill sound of cutting glass, etc.) are controlled and converted or reduced in volume by the present invention. The device described herein does not block off other sound signals in the natural environment that contain normal high-frequency and harmonic wave features. The device described herein treats such other sound signals as normal sound signals, which are to be amplified.

Digital Display

Conventional hearing aids currently on the market usually use manual volume adjustment (i.e., increasing or decreasing the volume by turning a small knob). Volume control is not precise nor easy, which annoys hearing aid users. This can also cause problems for audiologists or hearing instrument specialists.

In the present invention, the device may include a digital display. The digital display may present volume, battery life, background noise level or any other desired information in an easy to read format. For example, volume may be presented as large numerals on the digital display. The numerals may represent the decibel (dB) level of the sounds being received. The decibel level may be an absolute value in relation to an initial calibration standard or a relative value. The digital display may be illuminated and/or may comprise large numerals, making it easy to read and precise.

Figure 6:
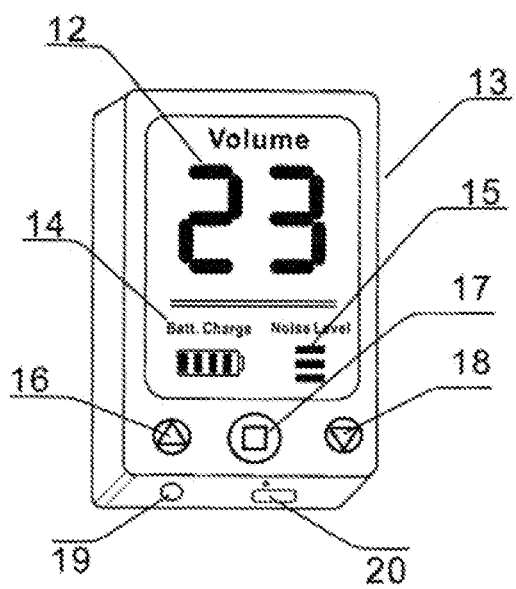
FIG. 6 depicts a housing comprising control and display function for a sound processing apparatus.

As an example, FIG. 6 depicts a control and display unit for a sound processing apparatus embodied as a hearing aid. The control and display unit comprises a digital volume display 12, a case 13, a digital battery life display 14, a background noise level display 15, a volume-up button 16, a power and background noise setting button 17, a volume down button 18, an earphone connector 19 and a USB charger connector 20. The digital volume display 12 reflects the sound volume numerically. The digital battery life display 14 shows how much battery power is left, relative to the battery being fully charged. When battery power is low, the message "Batt. Charge" may appear, reminding the user to recharge the hearing aid. Buttons may be touch screen, push-button or any other style of button.

The power and background noise setting button 17 permits the user to set the desired background noise level according to the surroundings or ambient noises, and the selected level is indicated by the Noise Level three bar scale. When the surroundings are quiet, the user can use the default background noise level (the lowest), which ensures that the hearing aid will be in the quiet mode when a conversation ends. If the surroundings are noisy, for instance, an air conditioner, a washer or a dryer is running, and the hearing aid amplifies surrounding noises, the user can press button 17 to increase the background noise level so that the hearing aid remains quiet, i.e., not to amplify the loud surrounding noises, when a conversation ends. In an alternative embodiment, two or more background noise setting buttons may be used to select continuous play or background noise level pre-set.

Earphone and Structural Design

Figure 7:
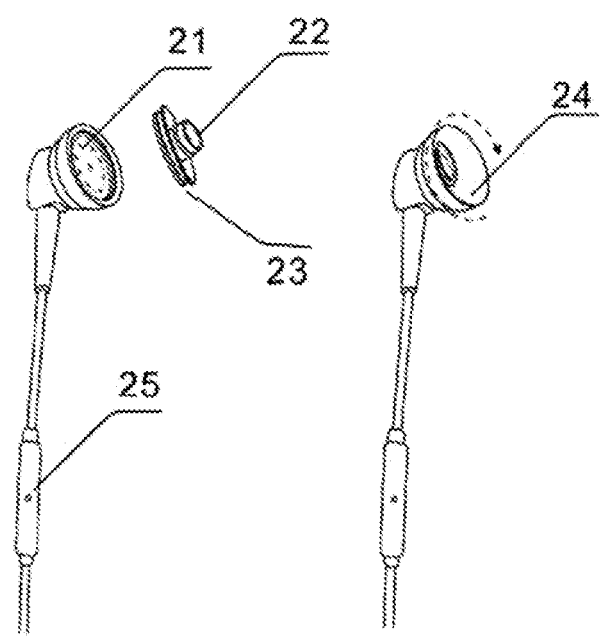
FIG. 7 depicts an example of an earphone/microphone combination for a sound processing apparatus.

In most conventional hearing aids, the earphone has a round tip. However, the external auditory canal in human ear is by no means round. With reference to FIG. 7, an earphone 24 for a hearing aid described herein may utilize an oval tip 22. The oval tip 22 ensures a better fit of the earphone into the ear canal so that better sound isolation may be achieved, external disturbance may be more effectively blocked, volume may be turned down and, importantly, feedback may be more efficiently controlled. The tip 22 may be mounted on a movable connector 23 that may be releasably mounted in the earphone 24 in front of a speaker 21. The oval tip 22 may be provided at an angle to the face of the movable connector 23 to facilitate insertion within the ear canal. The movable connector 23 may be snap fit on the interior opening of the earphone 24 proximal the speaker 21. As seen in the right hand image of FIG. 7, the earphone 24 may be designed so that the user can turn the connector 23 appropriately to change the orientation of the tip 22 so that the earphone 24 may be used in either the left or the right ear.

The tip 22 of the earphone 24 and a receiver of a high-sensitivity microphone 25 of the hearing aid may be spaced at least 3 cm apart. When earphone and microphone are placed in the same unit, sound in the earphone can easily feed into the nearby microphone that in turn feeds the audio signal to amplifier to amplify the sound. Feedback noise may then occur. Placing the earphone 24 sufficiently away from the microphone 25, such as at a distance of at lest 3 cm, effectively reduces such feedback noises. Users of the hearing aid can therefore also conduct telephone conversations without being overly concerned about feedback noise.

Since this new hearing aid separates the earphone and the microphone, as shown in FIG. 7, noises caused by unintentional contacts of the hearing aid case and the clothing are essentially eliminated and the occurrence of feedback noises is greatly reduced. The user can place a speaker of a telephone adjacent to the microphone 25 and hear the person on the phone better and conduct a conversation just as a non-hearing-impaired person does.

Various embodiments of the invention have now been described in detail. Those skilled in the art will appreciate that numerous modifications, adaptations and variations may be made to the embodiments without departing from the scope of the invention, which is defined by the appended claims. The scope of the claims should be given the broadest interpretation consistent with the description as a whole and not to be limited to these embodiments set forth in the examples or detailed description thereof.

What is claimed is:

1. A personal sound processing apparatus comprising:
a microphone, said microphone converting ambient sound signals to audio signals;
an electronic sound processor comprising,
a digital volume controller,
a microcontroller operatively connected between said digital volume controller and said microphone,
said microcontroller having a storage medium, and
a feedback tracker operatively connected between said microcontroller and said microphone;
an audio signal amplifier for amplifying audio signals to a volume level set by the digital volume controller, and
an earphone spaced apart from the microphone, the earphone reproducing sound from audio signals received from the audio signal amplifier,
wherein the microcontroller is configured to execute electronic instructions for recognizing at least one of a feedback noise condition and a background noise condition in the audio signals according to a threshold value stored in the storage medium and to send a control signal to the digital volume controller to adjust volume level of the digital volume controller in response to presence of the at least one of the feedback noise condition and the background noise condition.

2. The apparatus according to claim 1, further comprising an automatic gain controller (AGC) connected between the microphone and the microcontroller.

3. The apparatus according to claim 2, wherein the automatic gain controller (AGC) is connected in parallel to the microcontroller, the feedback tracker and the audio signal amplifier.

4. The apparatus according to claim 2, wherein the apparatus comprises a user interface for providing a user selectable indication of background noise level to the automatic gain controller or both the automatic gain controller and the microcontroller.

5. The apparatus according to claim 1, wherein the background noise condition is detected when the signal level of the audio signals is lower than the threshold value, and the microcontroller is configured to reduce the volume level upon recognizing the background noise condition and return the volume level to a user-selected value upon detecting the signal level of the audio signals exceeding the threshold value.

6. The apparatus according to claim 1, wherein the microcontroller further comprises an analog to digital converter and a microprocessor, and the storage medium comprises at least one of a non-transient electronic storage medium for storing the electronic instructions and the threshold value and a transient electronic storage medium for temporarily storing values arising from the execution of the electronic instructions by the microprocessor.

7. The apparatus according to claim 1, wherein the digital volume controller comprises an analog to digital converter, a digital potentiometer and a digital potentiometer interface controllable by the microcontroller for adjusting the digital potentiometer.

8. The apparatus according to claim 1, wherein the digital volume controller further comprises a zero crossing detection circuit, said zero crossing detection circuit having a capacitor to suppress step changes in direct current electric potentials caused by digitized adjustment to volume level.

9. The apparatus according to claim 1, wherein the digital volume controller is integrated with one of the microcontroller and the audio signal amplifier.

10. The apparatus according to claim 1, wherein the microcontroller is configured to compute the threshold value from background noise.

11. The apparatus according to claim 1, the digital volume controller is manually controllable by a user for at least one of setting an output volume level, setting the threshold value manually and setting the threshold value according to ambient sound environment.

12. The apparatus according to claim 1, wherein the automatic feedback tracker comprises a digital frequency divider circuit, said digital frequency divider circuit dividing frequencies of audio signals containing feedback noises or frequency divided feedback noises and transmitting said frequency divided audio signals to the microcontroller.

13. The apparatus according to claim 1, wherein the automatic feedback tracker comprises a timer and a counter connected to the timer, the counter being configured to divide the frequencies of a received signal by a pre-determined value and output frequency divided signals having frequencies higher than a minimum frequency, the minimum frequency being correlated to a pre-determined time length set by the timer.

14. The apparatus according to claim 13, wherein the microcontroller switches on and off audio signals provided to the audio signal amplifier repeatedly at intervals sufficiently fast to disrupt feedback noise pattern upon recognising a feedback noise condition.

15. The apparatus according to claim 13, wherein the microcontroller provides an alternative stored audio signal to the audio signal amplifier upon recognising a feedback noise condition.

16. The apparatus according to claim 13, wherein the timer resets the counter repeatedly at intervals equal to the pre-determined time length to remove signals with frequencies lower than the minimum frequency from the output frequency divided signals.

17. The apparatus according to claim 16, wherein the automatic feedback tracker further comprises a signal amplifier operatively connected between the microphone and the counter.

18. The apparatus according to claim 13, wherein the pre-determined value is one of 2, 4, 8, 16, 32, 64 or 128.

19. The apparatus according to claim 13, wherein the counter comprises a digital processor and a transient electronic storage medium, the digital processor being configured to perform the signal division and temporarily store values arising from the signal division for subsequent retrieval or transmittal to the microcontroller.

20. The apparatus according to claim 1, wherein the earphone comprises an oval tip on a moveable portion that is rotatable relative to a non-moveable portion of the earphone for changing orientation of the oval tip.

* * * * *